(12) United States Patent
Tu et al.

(10) Patent No.: US 6,579,791 B1
(45) Date of Patent: Jun. 17, 2003

(54) METHOD TO FORM DUAL DAMASCENE STRUCTURE

(75) Inventors: Yeur Luen Tu, Taichung (TW);
Chia-Shiung Tsai, Hsin-chu (TW);
Min-Hwa Chi, Hsin-chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/074,909

(22) Filed: Feb. 12, 2002

(51) Int. Cl.$^7$ .......................................... H01L 21/4763
(52) U.S. Cl. ........................................................ 438/637
(58) Field of Search ............................... 438/637, 638, 438/622, 949

(56) References Cited

U.S. PATENT DOCUMENTS

| | | | | | |
|---|---|---|---|---|---|
| 5,877,075 | A | * | 3/1999 | Dai et al. | 438/597 |
| 6,204,168 | B1 | * | 3/2001 | Naik et al. | 438/638 |
| 6,319,821 | B1 | * | 11/2001 | Liu et al. | 437/636 |
| 6,350,675 | B1 | * | 2/2002 | Chooi et al. | 438/624 |
| 6,458,516 | B1 | * | 10/2002 | Ye et al. | 430/317 |
| 6,458,705 | B1 | * | 10/2002 | Hung et al. | 438/692 |

OTHER PUBLICATIONS

Wolf., (Silicon Processing for the VSLI Era, Lattice Press, vol. 2, pp. 194–195).*
Article entitled "0.15 μm ArF Excimer Laser Lithography using Top Surface Imaging with High Contrast Silyation Agent B(DMA)DS", T. Ohfuji et al., 1994 Symposium on VLSI Tech. Digest of Tech. Papers, pp. 93–94.
Article entitled "CVD Photoresist Processes for Sub–0.18 Design Rules," T. Weidman et al., 1998 Symposium on VLSI Tech. Digest of Technical Papers, pp. 166–167.

* cited by examiner

*Primary Examiner*—Hoai Ho
*Assistant Examiner*—Quoc Hoang
(74) *Attorney, Agent, or Firm*—George O. Saile; Stephen B. Ackerman

(57) ABSTRACT

A method of fabricating a dual damascene opening, comprising the following sequential steps. A structure having a stop layer formed over a second low-k material layer formed over a stop layer formed over a first low-k material layer is provided. These layers are etched to form a via opening exposing a portion of the structure. A photoresist layer is formed over the second low-k material layer stop layer and filling the via opening. The photoresist layer having a treated upper portion including a central trench pattern area that is wider than, and substantially centered over, the via opening. The treated upper portion of the photoresist layer preventing any effects to the underlying photoresist layer so that the underlying photoresist layer does not deleteriously interact with the first or second low-k material layer. Removing: (1) the central trench pattern area of the upper treated portion of the photoresist and the photoresist under the central trench pattern area a to form a trench pattern opening exposing a portion of the second low-k material layer stop layer under the removed central trench pattern area; and (2) the photoresist layer within the via opening while leaving a portion of the photoresist layer within the via opening overlying the portion of the structure that was exposed by the via opening. Transferring the trench pattern opening to the second low-k material layer stop layer and the second low-k material layer to form a trench substantially centered over the remaining via opening and completing the dual damascene opening.

49 Claims, 4 Drawing Sheets

METHOD TO FORM DUAL DAMASCENE STRUCTURE

BACKGROUND OF THE INVENTION

A typical prior art via-first dual damascene process to form a dual damascene structure within a CVD low-k intermetal dielectric (IMD) layer includes: via formation (patterning and etching); formation of a protective layer at the bottom of the via; then trench formation (patterning and etching). Once the via is formed, the CVD low-k material is exposed along the via's sidewalls.

The article entitled "0.15 µm ArF Excimer Laser Lithography using Top Surface Imaging with High Contrast Silylation Agent B(DMA)DS", T. Ohfuji and N. Aizaki, 1994 Symposium on VLSI Technology Digest of Technical Papers, pages 93 and 94, describes silylation with B(DMA)DS and applied to a 193 nm wavelength ArF laser.

The article entitled "CVD Photoresist Processes for Sub-0.18 Design Rules", T. Weidman et al., 1998 Symposium on VLSI Technology Digest of Technical Papers, pages 166 and 167, describes a process for photoresist deposition for imaging a layer for 193 nm wavelength lithography.

SUMMARY OF THE INVENTION

Accordingly, it is an object of an embodiment of the present invention to provide an improved method of forming dual damascene structures.

It is another object of an embodiment of the present invention to prevent interaction of CVD low-k material with the DUV photoresist during trench patterning.

Other objects will appear hereinafter.

It has now been discovered that the above and other objects of the present invention may be accomplished in the following manner. Specifically, a structure having a stop layer formed over a second low-k material layer formed over a stop layer formed over a first low-k material layer is provided. These layers are etched to form a via opening exposing a portion of the structure. A photoresist layer is formed over the second low-k material layer stop layer and filling the via opening. The photoresist layer having a treated upper portion including a central trench pattern area that is wider than, and substantially centered over, the via opening. The treated upper portion of the photoresist layer preventing any effects to the underlying photoresist layer so that the underlying photoresist layer does not deleteriously interact with the first or second low-k material layer. Removing: (1) the central trench pattern area of the upper treated portion of the photoresist and the photoresist under the central trench pattern area to form a trench pattern opening exposing a portion of the second low-k material layer stop layer under the removed central trench pattern area; and (2) the photoresist layer within the via opening while leaving a portion of the photoresist layer within the via opening overlying the portion of the structure that was exposed by the via opening. Transferring the trench pattern opening to the second low-k material layer stop layer and the second low-k material layer to form a trench substantially centered over the remaining via opening and completing the dual damascene opening.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

A Problem Known to the Inventors

The following problem is known to the inventors and is not to be considered prior art for the purposes of this invention.

One problem known to the inventors in the typical prior art via-first dual damascene process is having the exposed CVD low-k material within the via formed in the IMD layer. The exposed CVD low-k material on the via sidewalls will interact with materials in subsequent process steps, such as a deep ultraviolet (DUV) patterning step in the formation of the trench of the dual damascene structure.

During the photo exposure in the trench formation, the DUV photoresist will generate carboxylic acid after the DUV exposure which can interact with unsaturated bonds (e.g. as C=O and CN with excess e-pair in black diamond and also other bonds such as in SiOH) in CVD low-k materials that may comprise the IMD layer. Such an interaction will result in residual materials that are difficult to remove after the trench patterning in a typical prior art via-first dual damascene process.

First Embodiment—Silylation Process Scheme
Initial Structure—First Embodiment

Figure 1:
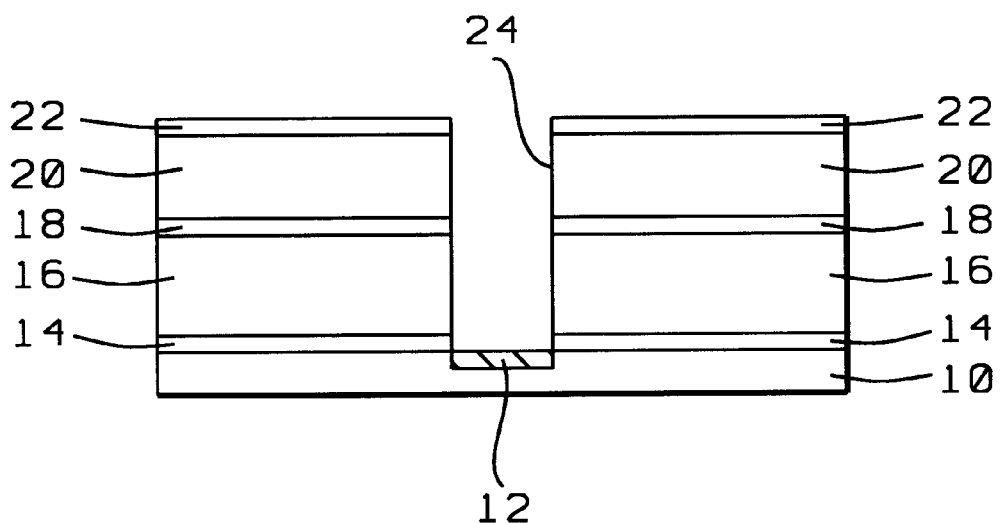
FIGS. 1 to 4 schematically illustrate a first preferred embodiment of the present invention.

FIG. 1 illustrates a structure 10 with an exposed conductive structure 12.

Structure 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Conductive structure 12 is preferably comprised of a metal or metal alloy such as, for example, aluminum, copper, gold, etc., and may be a conductive plug or conductive line.

A first stop layer 14 is formed over structure 10 and conductive structure 12. A first CVD low-k material layer 16 is formed over the first stop layer 14. A second stop layer 18 is formed over the first low-k material layer 16. A second CVD low-k material layer 20 is formed over the second stop layer 18. A third stop layer 22 is then formed over the second CVD low-k material layer 20.

The first, second and third stop layers 14, 18, 22 are preferably formed of nitride, silicon nitride (SiN), silicon carbide (SiC) or silicon oxynitride (SiON); and are preferably from about 300 to 600 Å thick and more preferably from about 400 to 600 Å.

The first and second CVD low-k material layers 16, 20 may be intermetal dielectric (IMD) layers and may be formed of Black Diamond™ manufactured by Applied Materials or Coral™ available from Novellus The first and second CVD low-k material layers 16, 20 are preferably from about 3000 to 7000 Å thick and more preferably from about 4000 to 6000 Å.

As shown in FIG. 1, a via patterning and etching is performed through the third stop layer 22, the second low-k material layer 20, the second stop layer 18, the first low-k material layer 16 and the first stop layer 14 to form via 24 exposing at least a portion of the conductive structure 12. The via 24 patterning and etching may be performed by conventional methods and processes.

Silylation Process

Figure 2:
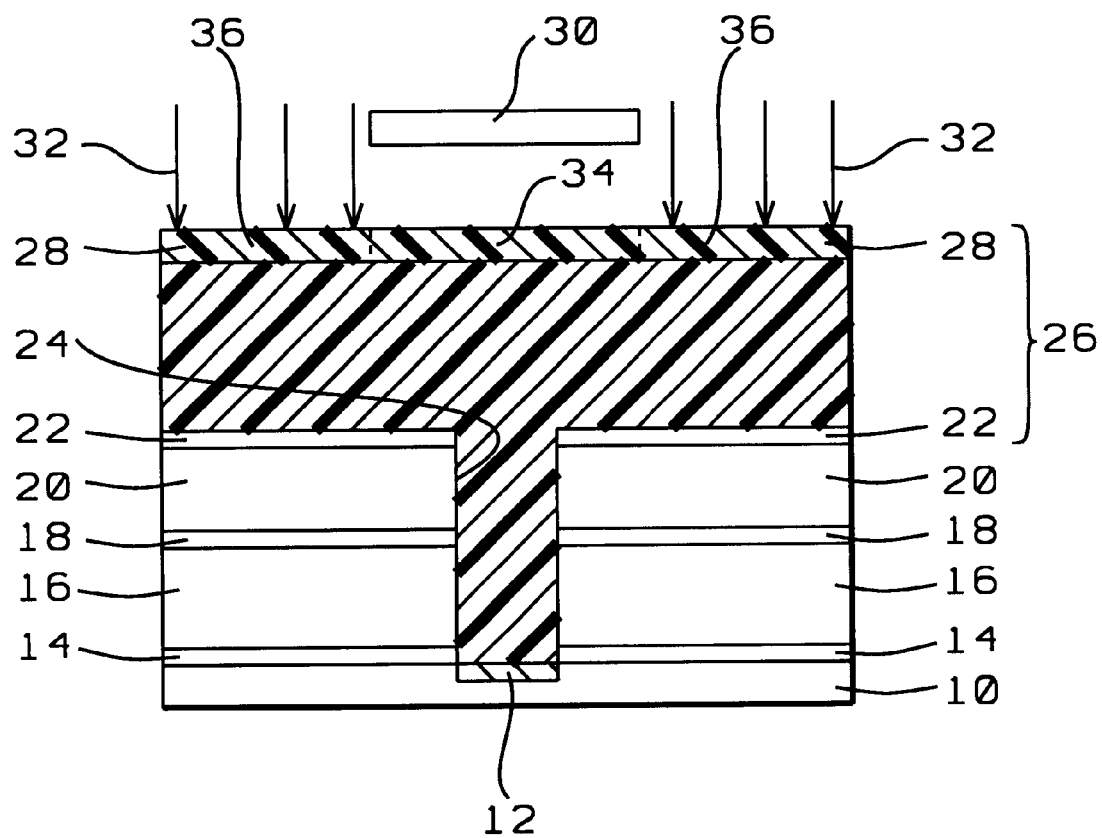

As shown in FIG. 2, a silylation photoresist (PR) layer 26 is formed over the structure of FIG. 1, filling via 24. Silylation PR layer 26 is preferably formed by spin coating and is preferably a material comprised of a photoacid generator (PAG). Silylation PR layer 26 is preferably formed to a height of from about 4000 to 8000 Å and more preferably from about 4000 to 6000 Å above the third stop layer 22.

Then, using optical trench mask 30 roughly centered over via 24 and having a width greater than via 24, the upper portion 28 of silylation PR layer 26 is exposed as at 32, using optical trench mask 30 as a mask, and preferably using deep ultraviolet (DUV) light in a top surface image process. DUV exposure 32 includes the presence of oxygen ($O_2$). Upper portion 28 of silylation PR layer 26 has a thickness of preferably from about 1000 to 4000 Å.

The cross-linking in the trench pattern area 36 of upper portion 28 of silylation PR layer 26 is achieved by then performing a hard bake at a temperature of from about 100 to 200° C. No cross-linking is achieved in the center, non-exposed area 34 of upper portion 28 of silylation PR layer 26.

Then a silylation process is performed to transform the outer, exposed areas 36 of upper portion 28 of silylation PR layer 26 into silylated portions 36 having a thickness of preferably from about 1000 to 4000 Å. The non-cross-linked center trench pattern area 34 of upper PR layer portion 28 does not react to the silylation process. The silylation process is performed using tetra-methyl-di-silazane (TMDS) at a temperature of preferably from about 100 to 200° C.

It is noted that the cross-linking, silylation process and DUV photo exposure occurs only within the upper portion 28 of silylation PR layer 26 (also known as top surface imaging) and therefore no carboxylic acid is formed within the silylation PR layer 26 at the via 24 sidewall and thus there is no adverse interaction between the silylation PR layer 26 and the exposed first and second CVD low-k material layers 16, 20 after the DUV exposure 32. This eliminates the PR poison issue known to the inventors as discussed above as none of the photoresist adjacent to the exposed portions of the low-k material layers 16, 20 is exposed to DUV.

Reactive Ion Etch (RIE)

Figure 3:
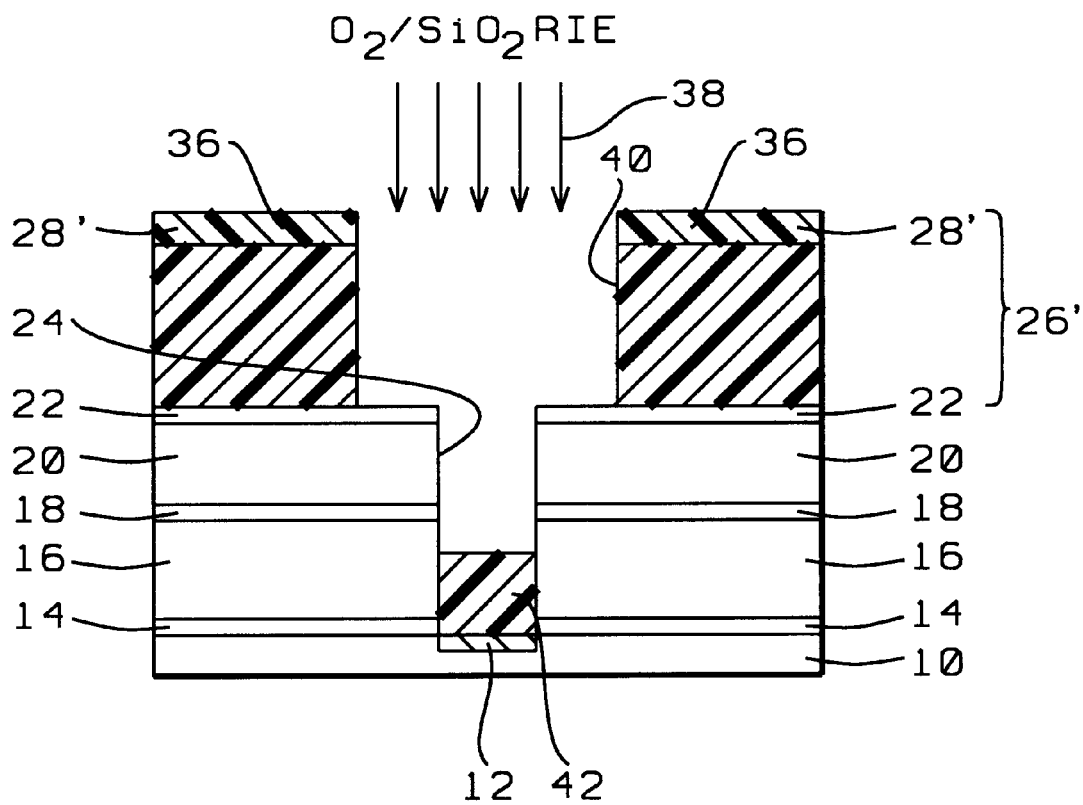

As shown in FIG. 3, using the outer, cross-linked portions 36 of silylation PR layer 26 as masks, the structure of FIG. 2 is subjected to a reactive ion etch (RIE) 38 that etches away the center, unexposed portion 34 of silylation PR layer 26 and the portion of PR layer 26 substantially beneath the unexposed PR portion 34 down to the second stop layer 18 (forming a trench pattern opening 40 within the etched silylation PR layer 26' above the second stop layer 18) and a portion of the PR layer 26 within the via 24 but leaving a portion 42 of PR layer 26' within the via 24 overlying the conductive structure 12. The portion 42 of PR layer 26' overlying the conductive structure 12 protects the conductive structure 12 during the subsequent processes and may be left with proper control of the RIE process 38.

RIE 38 is preferably an $O_2$ and $SO_2$ RIE conducted at the following parameters:

a pressure of preferably from about 5 to 50 mTorr;
a power of preferably from about 100 to 500 W;
a temperature of preferably from about 20 to 60° C.;
an $O_2$ flow rate of preferably from about 20 to 200 sccm;
an $SO_2$ flow rate of preferably from about 10 to 80 sccm;
a He flow rate of preferably from about 40 to 80 sccm; and
a $CF_4$ flow rate of preferably from about 0 to 50 sccm.

Formation of Trench 44 Over the Remaining Via 24' to Form a Dual Damascene Opening 46

Figure 4:
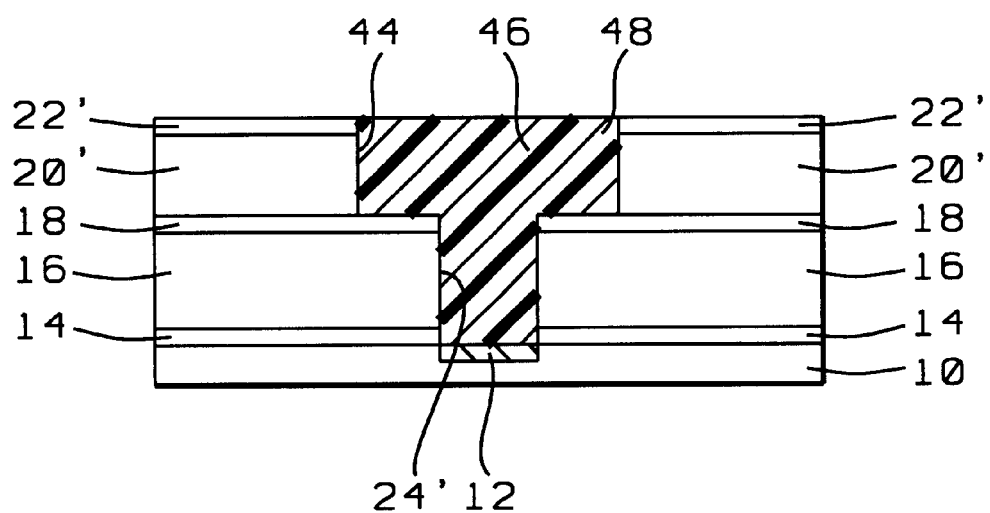

As shown in FIG. 4, the trench pattern opening 40 within the etched PR layer 26' is transferred to the lower third stop layer 22' and second CVD low-k layer 20' above the second stop layer 18 preferably by a dry etch process to form trench opening 44 over the remaining via opening 24'. PR portion 42 overlying the conductive structure 12 helps to protect the conductive structure 12 from etching damage.

The PR portion 42 and the remaining etched silylation PR layer 26' with the outer, exposed areas 36 of upper etched portion 28' of etched silylation PR layer 26' are stripped away.

Trench opening 44 and remaining via opening 24' together form dual damascene opening 46 that exposes at least a portion of conductive structure 12.

Further processing may continue, including, for example, a planarized conductive dual damascene structure 48 within dual damascene opening 46 that is preferably comprised of a metal such as aluminum, copper or gold, for example.

Second Embodiment—CVD Photoresist Scheme

Initial Structure—Second Embodiment

Figure 5:
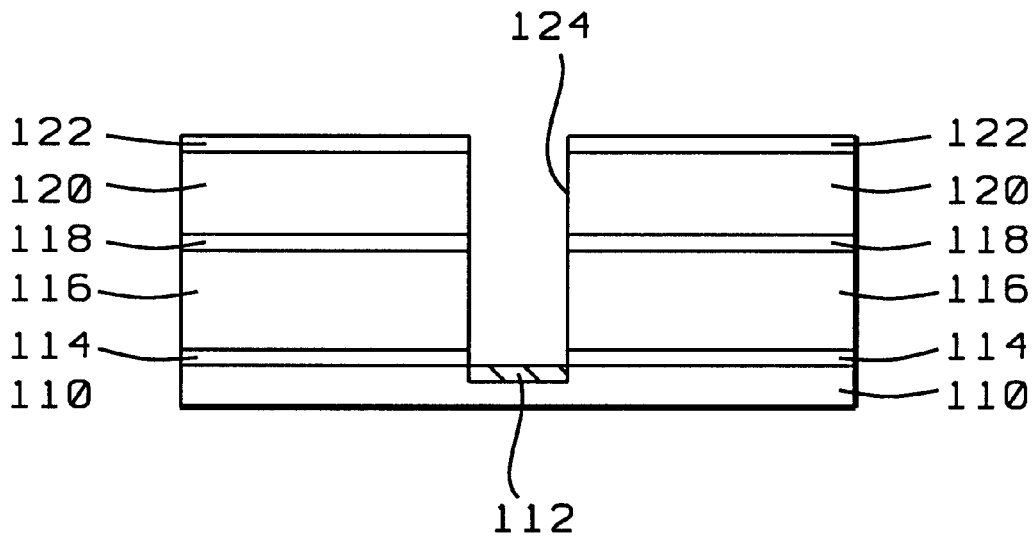
FIGS. 5 to 8 schematically illustrate a second preferred embodiment of the present invention.

The initial structure of the second embodiment is essentially the same as the initial structure for the first embodiment. That is FIG. 5 illustrates a structure 110 with an exposed conductive structure 112.

Structure 110 is preferably a silicon substrate and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

Conductive structure 112 is preferably comprised of a metal or metal alloy such as, for example, aluminum, copper, gold, etc., and may be a conductive plug or conductive line.

A first stop layer 114 is formed over structure 110 and conductive structure 112. A first CVD low-k material layer 116 is formed over the first stop layer 114. A second stop layer 118 is formed over the first CVD low-k material layer 116. A second CVD low-k material layer 120 is formed over the second stop layer 118. A third stop layer 122 is then formed over the second CVD low-k material layer 120.

The first, second and third stop layers 114, 118, 122 are preferably formed of nitride, silicon nitride (SiN), silicon carbide (SiC) or silicon oxynitride (SiON); and are each preferably from about 300 to 600 Å thick and more preferably from about 400 to 600 Å.

The first and second CVD low-k material layers 116, 120 may be intermetal dielectric (IMD) layers and may be formed of Black Diamond™ (Applied Materials) or Coral™ (Novellus) and are more preferably formed of Black Diamond. The first and second CVD low-k material layers 116, 120 are preferably from about 3000 to 7000 Å thick and more preferably from about 4000 to 6000 Å.

As shown in FIG. 5, a via patterning and etching is performed through the third stop layer 122, the second CVD low-k material layer 120, the second stop layer 118, the first CVD low-k material layer 116 and the first stop layer 114 to form via 124 exposing at least a portion of the conductive structure 112. The via 124 patterning and etching may be performed by conventional methods and processes.

Formation of Undercoat PR Layer 126 and CVD PR 128

Figure 6:
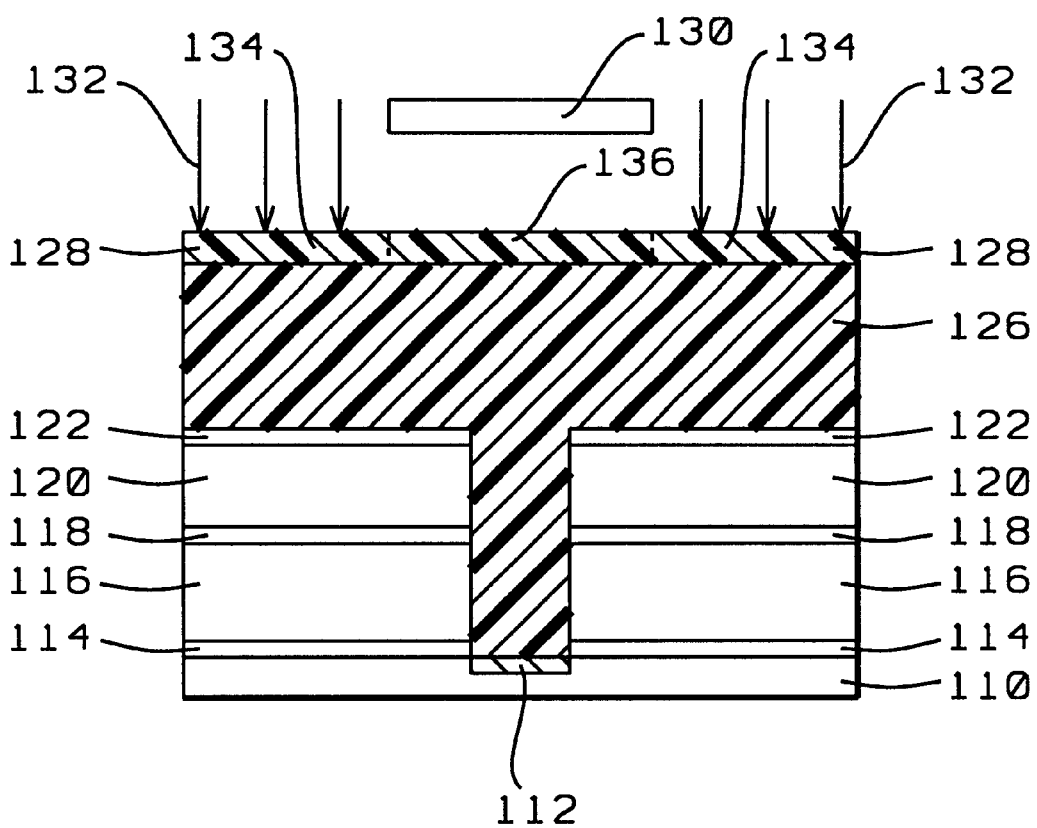

As shown in FIG. 6, an undercoat photoresist (PR) layer 126 is formed over the structure of FIG. 5, filling via 124. The undercoat PR layer 126 is then hard-baked.

Undercoat PR layer 126 is preferably formed by spin coating and is preferably a DUV PR or I-line PR. Undercoat PR layer 126 is preferably formed to a height of from about 4000 to 8000 Å and more preferably from about 4000 to 6000 Å above the third stop layer 122.

In a key step of the second embodiment and as shown in FIG. 6, a chemical vapor deposition (CVD) PR layer 128 is then formed over the undercoat PR layer 126 to a thickness of preferably from about 900 to 2600 Å and more preferably from about 1000 to 2500 Å. CVD PR layer 128 is preferably formed by a plasma enhanced chemical vapor deposit (PECVD) method. Preferably, methylsilane gas is deposited and then polymerized by a CVD method, and more preferably by a plasma enhanced chemical vapor deposition (PECVD) method at a low temperature of preferably from about 65 to 135° C. and more preferably about 150° C., to form a plasma polymerized methylsilane (PPMS) polymer CVD PR layer 128.

Then, using optical trench mask 130 roughly centered over via 124 and having a width greater than via 124, the PPMS PR layer 128 is exposed as at 132, using optical trench mask 130 as a mask, and preferably using deep ultraviolet (DUV) light. DUV exposure 132 includes the presence of oxygen ($O_2$) which further networks the PPMS polymer comprising the exposed PPMS PR layer 128 into a glass-like siloxane (that is referred to as "PPMSO") portions 134 that act as hard mask portions, and leaving an unexposed portion 136 of PPMS PR layer 128 substantially beneath trench mask 130.

It is noted that by using PPMS PR layer 128, undercoat PR layer 126 is not exposed to the DUV light 132 and therefore no carboxylic acid is formed within the undercoat PR layer 126 and thus there is no adverse interaction between the undercoat PR layer 126 and the exposed first and second CVD low-k material layers 116, 120 after the DUV exposure 132. This eliminates the PR poison issue known to the inventors as discussed above as none of the photoresist adjacent to the exposed portions of the CVD low-k material layers 116, 120 is exposed to DUV.

$Cl_2$ Plasma Treatment/$O_2$ RIE 138

Figure 7:
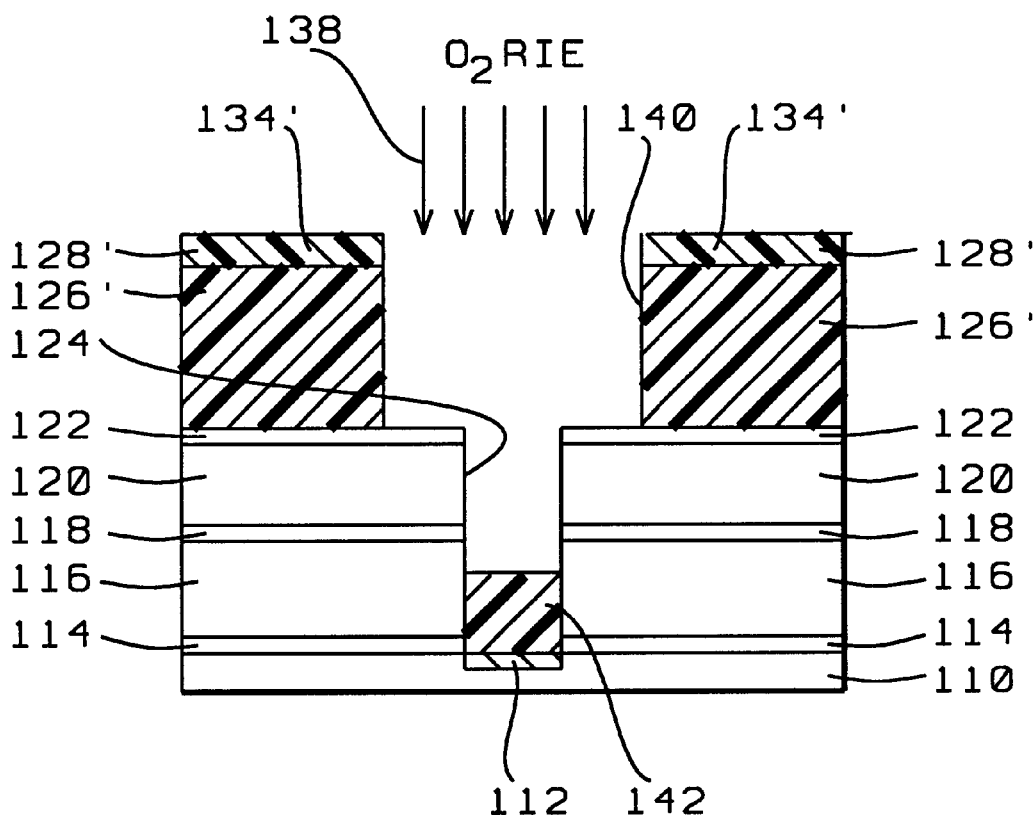

As shown in FIG. 7, $Cl_2$ plasma is used to remove the unreacted/unexposed PPMS PR portion 136 (i.e. develop into negative tone) at the following parameters:

a pressure of preferably from about 4 to 10 mTorr;
a source power of preferably from about 300 to 600 W;
a temperature of preferably from about 0 to 60° C.;
an HBr flow rate of preferably from about 80 to 150 sccm;
a $Cl_2$ flow rate of preferably from about 50 to 100 sccm; and
an He-$O_2$ flow rate of preferably from about 10 to 30 sccm.

Then, using hard mask PPMSO portions 134 of exposed PPMS PR layer 128 as masks, the structure of FIG. 6 is subjected to an $O_2$ reactive ion etch (RIE) 138 that etches away the undercoat PR 126 substantially beneath the now removed PPMS PR portion 136 down to the second stop layer 118 (forming a trench pattern opening 140 within the etched undercoat PR layer 126' above the second stop layer 118) and a portion of the undercoat PR 126 within the via 124 but leaving a portion 142 of undercoat PR within the via 124 overlying the conductive structure 112. The portion 142 of undercoat PR overlying the conductive structure 112 protects the conductive structure 112 during the subsequent processes and may be left with proper control of the $O_2$ RIE process 138.

The $O_2$ RIE 138 also transforms the PPMSO portions 134 into low-density oxide forming low-density oxide portions 134'.

The $O_2$ RIE 138 is conducted at the following parameters:

a source power of preferably from about 600 to 950 W;
a pressure of preferably from about 4 to 10 mTorr; and
an $O_2$ flow rate of preferably from about 30 to 60 sccm.

Formation of Trench 144 Over the Remaining Via 124' to Form a Dual Damascene Opening 146

Figure 8:
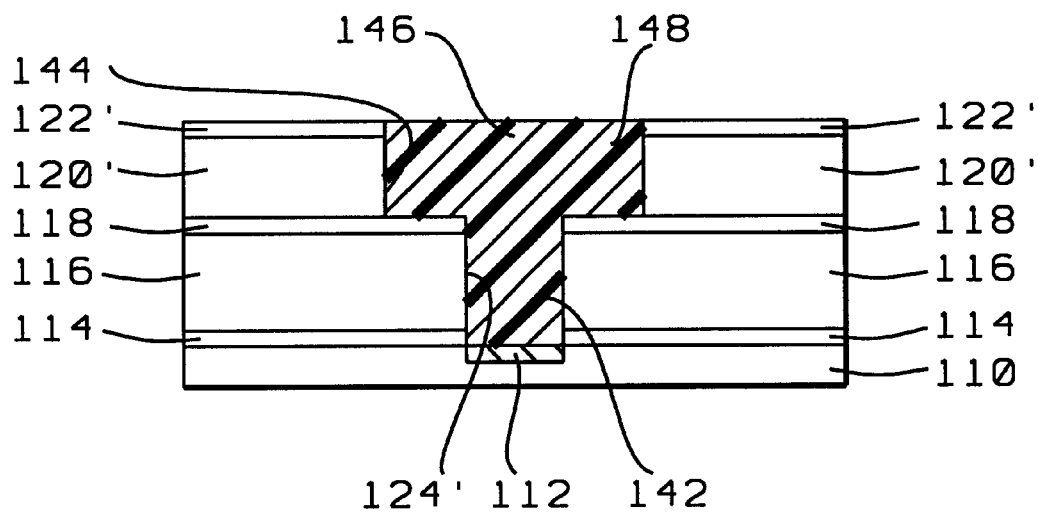

As shown in FIG. 8, the trench pattern opening 140 within the etched undercoat PR layer 126' is transferred to the lower third stop layer 122 and the second CVD low-k layer 120 above the second stop layer 118 preferably by a dry etch process to form trench opening 144 over the remaining via opening 124'. The dry etch process removes the low-density oxide portions 134' (formerly PPMSO portions 134) so that the etched undercoat PR 126' functions as a mask when etching the exposed third stop layer 122 and the then the second CVD low-k material layer 120 when forming trench opening 144.

The undercoat PR portion 142 overlying the conductive structure 112 and the etched undercoat PR 126' that functioned as a mask in forming trench opening 144 is then stripped away.

Trench opening 144 and remaining via opening 124' together form dual damascene opening 146 that exposes at least a portion of conductive structure 112.

Further processing may continue, including, for example, a planarized conductive dual damascene structure 148 within dual damascene opening 146 that is preferably comprised of a metal such as aluminum, copper or gold, for example.

Advantages of one or more Embodiments of the Present Invention

The advantages of one or more embodiments of the present invention include:

1. in-situ formation of protective layer at the bottom of via opening thus reducing the number of steps otherwise required to form such a protective layer;
2. interaction between DUV PR and CVD low-k material is prevented; and
3. better resolution is achieved due to the patterning occurring only at the upper thin layer.

While particular embodiments of the present invention have been illustrated and described, it is not intended to limit the invention, except as defined by the following claims.

We claim:

1. A method of fabricating a dual damascene opening, comprising the sequential steps of:

providing a structure having a first low-k material layer formed thereover;

forming a first stop layer over the first low-k material layer;

forming a second low-k material layer over the first stop layer;

forming a second stop layer over the second low-k material layer;

etching: the second stop layer; the second low-k material layer; the first stop layer; and the first low-k material layer to form a via opening exposing a portion of the structure;

forming a photoresist layer over the second stop layer and filling the via opening; the photoresist layer having a treated upper portion including a central trench pattern area that is wider than, and substantially centered over, the via opening; the treated upper portion of the photoresist layer preventing any effects to the underlying photoresist layer so that the underlying photoresist layer does not deleteriously interact with the first or second low-k material layer;

removing:
the central trench pattern area of the upper treated portion of the photoresist and the photoresist under the central trench pattern area to form a trench pattern opening exposing a portion of the second stop layer under the removed central trench pattern area; and
the photoresist layer within the via opening while leaving a portion of the photoresist layer within the via opening overlying the portion of the structure that was exposed by the via opening; and transferring the trench pattern opening to the second stop layer and the second low-k material layer to form a trench substantially centered over the remaining via opening and completing the dual damascene opening.

2. The method of claim 1, wherein the structure includes an exposed conductive structure that is exposed by the via opening.

3. The method of claim 1, wherein the first stop layer and the second stop layer are each comprised of a CVD material selected from the group consisting of nitride, silicon nitride, SiC and SiON.

4. The method of claim 1, wherein a third stop layer is formed over the structure and wherein the third stop layer is also etched to form the via opening exposing the portion of the structure.

5. The method of claim 1, wherein the first stop layer and the second stop layer each have a thickness of from about 300 to 600 Å; the first low-k material layer has a thickness of from about 3000 to 7000 Å; and the second low-k material layer has a thickness of from about 3000 to 7000 Å.

6. The method of claim 1, wherein the first stop layer and the second stop layer each have a thickness of from about 400 to 600 Å; the first low-k material layer has a thickness of from about 4000 to 6000 Å; and the second low-k material layer has a thickness of from about 4000 to 6000 Å.

7. The method of claim 1, wherein the trench pattern opening is transferred to the second stop layer and the second low-k material layer to form a trench using processing including a reactive ion etch process.

8. The method of claim 1, including the step of forming a planarized conductive dual damascene structure in the dual damascene opening.

9. The method of claim 1, including the step of forming a planarized conductive dual damascene structure in the dual damascene opening; the planarized conductive dual damascene structure being comprised of a material selected from the group consisting of aluminum, copper and gold.

10. The method of claim 1, wherein the photoresist layer is formed to a thickness of from about 4000 to 8000 Å above the second stop layer.

11. The method of claim 1, wherein the photoresist layer is formed to a thickness of from about 4000 to 6000 Å above the second stop layer.

12. The method of claim 1, wherein the photoresist layer is formed by spin coating.

13. The method of claim 1, wherein the photoresist layer is comprised of a photoacid generator.

14. The method of claim 1, wherein the trench pattern opening is transferred to the second stop layer and the second low-k material layer to form a trench using processing including a silylation process and a reactive ion etch process.

15. The method of claim 1, wherein the underlying photoresist layer is comprised of a deep ultraviolet photoresist or an I-line photoresist.

16. The method of claim 1, wherein the trench pattern opening is transferred to the second stop layer and the second low-k material layer to form a trench using processing including a reactive ion etch process.

17. The method of claim 1, wherein the trench pattern opening is transferred to the second stop layer and the second low-k material layer to form a trench using processing including an $O_2$ reactive ion etch process.

18. The method of claim 1, wherein the treated upper portion of the photoresist layer is a silylation layer.

19. The method of claim 1, wherein the treated upper portion of the photoresist layer is PPMA.

20. A method of fabricating a dual damascene opening, comprising the sequential steps of:

providing a structure having a first low-k material layer formed thereover;

forming a first stop layer over the first low-k material layer;

forming a second low-k material layer over the first stop layer;

forming a second stop layer over the second low-k material layer;

etching: the second stop layer; the second low-k material layer; the first stop layer; and the first low-k material layer to form a via opening exposing a portion of the structure;

forming a silylation photoresist layer over the second stop layer and filling the via opening;

exposing an upper portion of the silylation photoresist layer portion using an optical trench mask substantially centered over the via opening as a mask to form an unexposed silylation photoresist layer portion substantially centered over the via opening; the unexposed silylation photoresist layer portion being bracketed by exposed silylation photoresist portions; the trench mask opening and the unexposed silylation photoresist layer portion each having a width greater than the width of the via opening;

subjecting the upper portion of the silylation photoresist layer to a hard bake process to form cross-links in the exposed silylation photoresist layer portions;

using a silylation process to transform the exposed, cross-linked silylation photoresist layer portions into silylation portions;

removing:
the unexposed non-cross-linked silylation photoresist layer portion and a portion of the silylation photoresist layer under the unexposed non-cross-linked silylation photoresist layer portion to form a trench pattern opening exposing the second stop layer under the non-exposed cross-linked silylation photoresist layer portion; and
the silylation photoresist layer within the via opening while leaving a portion of the silylation photoresist layer within the via opening overlying the portion of the structure that was exposed by the via opening; and transferring the trench pattern opening to the second stop layer and the second low-k material layer to form a trench substantially centered over the remaining via opening and completing the dual damascene opening.

21. The method of claim 20, wherein the structure includes an exposed conductive structure that is exposed by the via opening.

22. The method of claim 20, wherein the first stop layer and the second stop layer are each comprised of a material selected from the group consisting of nitride, silicon nitride, SiC and SiON.

23. The method of claim 20, wherein a third stop layer is formed over the structure and wherein the third stop layer is also etched to form the via opening exposing the portion of the structure.

24. The method of claim 20, wherein the first stop layer and the second stop layer each have a thickness of from about 300 to 600 Å; the first low-k material layer has a thickness of from about 3000 to 7000 Å; and the second low-k material layer has a thickness of from about 3000 to 7000 Å.

25. The method of claim 20, wherein the first stop layer and the second stop layer each have a thickness of from about 400 to 600 Å; the first low-k material layer has a thickness of from about 4000 to 6000 Å; and the second low-k material layer has a thickness of from about 4000 to 6000 Å.

26. The method of claim 20, wherein the trench pattern opening is transferred to the second stop layer and the second low-k material layer to form a trench using processing including a reactive ion etch process.

27. The method of claim 20, including the step of forming a planarized conductive dual damascene structure in the dual damascene opening.

28. The method of claim 20, including the step of forming a planarized conductive dual damascene structure in the dual damascene opening; the planarized conductive dual damascene structure being comprised of a material selected from the group consisting of aluminum, copper and gold.

29. The method of claim 20, wherein the silylation photoresist layer is formed to a thickness of from about 4000 to 8000 Å above the second stop layer.

30. The method of claim 20, wherein the silylation photoresist layer is formed to a thickness of from about 4000 to 6000 Å above the second stop layer.

31. The method of claim 20, wherein the silylation photoresist layer is formed by spin coating.

32. The method of claim 20, wherein the silylation photoresist layer is comprised of a photoacid generator.

33. The method of claim 20, wherein the trench pattern opening is transferred to the second stop layer and the second low-k material layer to form a trench using processing including a silylation process and a reactive ion etch process.

34. A method of fabricating a dual damascene opening, comprising the sequential steps of:

providing a structure having a first low-k material layer formed thereover;

forming a first stop layer over the first low-k material layer;

forming a second low-k material layer over the first stop layer;

forming a second stop layer over the second low-k material layer;

etching: the second stop layer; the second low-k material layer; the first stop layer; and the first low-k material layer to form a via opening exposing a portion of the structure;

forming an undercoat photoresist layer over the second stop layer and filling the via opening;

forming a protective PPMS photoresist layer over the undercoat photoresist layer;

exposing the protective PPMS photoresist layer using a trench mask substantially centered over the via opening as a mask to form exposed protective PPMS photoresist layer portions bracketing an unexposed protective PPMS photoresist layer portion substantially centered over the via opening; the trench mask and the unexposed protective PPMS photoresist layer portion each having a width greater than the width of the via opening; the protective PPMS photoresist layer portion preventing any effects to the undercoat photoresist layer during the exposure of the protective PPMS photoresist layer so that the undercoat photoresist layer does not deleteriously interact with the first or second low-k material layer;

removing:
the unexposed protective PPMS photoresist layer portion and a portion of the undercoat photoresist layer under the unexposed protective PPMS photoresist layer portion to form a trench pattern opening exposing the second stop layer under the unexposed protective PPMS photoresist layer portion; and the undercoat photoresist layer within the via opening while leaving a portion of the undercoat photoresist layer within the via opening overlying the portion of the structure that was exposed by the via opening; and transferring the trench pattern opening to the second stop layer and the second low-k material layer to form a trench substantially centered over the remaining via opening and completing the dual damascene opening.

35. The method of claim 34, wherein the undercoat photoresist is comprised of a DUV photoresist or an I-line photoresist.

36. The method of claim 34, wherein the structure includes an exposed conductive structure that is exposed by the via opening.

37. The method of claim 34, wherein the first stop layer and the second stop layer are each comprised of a material selected from the group consisting of nitride, silicon nitride, SiC and SiON.

38. The method of claim 34, wherein a third stop layer is formed over the structure and wherein the third stop layer is also etched to form the via opening exposing the portion of the structure.

39. The method of claim 34, wherein the first stop layer and the second stop layer each have a thickness of from about 300 to 600 Å; the first low-k material layer has a thickness of from about 3000 to 7000 Å; and the second low-k material layer has a thickness of from about 3000 to 7000 Å.

40. The method of claim 34, wherein the first stop layer and the second stop layer each have a thickness of from about 400 to 600 Å; the first low-k material layer has a thickness of from about 4000 to 6000 Å; and the second low-k material layer has a thickness of from about 4000 to 6000 Å.

41. The method of claim 34, wherein the trench pattern opening is transferred to the second stop layer and the second low-k material layer to form a trench using processing including a reactive ion etch process.

42. The method of claim 34, including the step of forming a planarized conductive dual damascene structure in the dual damascene opening.

43. The method of claim 34, including the step of forming a planarized conductive dual damascene structure in the dual damascene opening; the planarized conductive dual damascene structure being comprised of a material selected from the group consisting of aluminum, copper and gold.

44. The method of claim 34, wherein the undercoat photoresist layer is formed to a thickness of from about 4000 to 8000 Å above the second stop layer; and the protective PPMS photoresist layer is formed to a thickness of from about 900 to 2600 Å.

45. The method of claim 34, wherein the undercoat photoresist layer is formed to a thickness of from about 4000 to 6000 Å above the second stop layer; and the protective PPMS photoresist layer is formed to a thickness of from about 1000 to 2500 Å.

46. The method of claim 34, wherein the undercoat photoresist layer is formed by spin coating and the protective PPMS photoresist layer is formed by plasma enhanced chemical vapor deposition.

47. The method of claim 34, wherein the protective PPMS photoresist layer is formed by plasma enhanced chemical vapor deposition of methylsilane gas.

48. The method of claim 34, wherein the trench pattern opening is transferred to the second stop layer and the second low-k material layer to form a trench using processing including a reactive ion etch process.

49. The method of claim 34, wherein the trench pattern opening is transferred to the second stop layer and the second low-k material layer to form a trench using processing including an $O_2$ reactive ion etch process.

* * * * *